United States Patent
Vänerhav et al.

(10) Patent No.: US 11,509,235 B2
(45) Date of Patent: Nov. 22, 2022

(54) MODULAR POWER SUPPLY

(71) Applicant: Volvo Car Corporation, Gothenburg (SE)

(72) Inventors: Axel Vänerhav, Lerum (SE); Sofia Lorensson, Gothenburg (SE)

(73) Assignee: Volvo Car Corporation, Gothenburg (SE)

( * ) Notice: Subject to any disclaimer, the term of this patent is extended or adjusted under 35 U.S.C. 154(b) by 82 days.

(21) Appl. No.: 17/182,595

(22) Filed: Feb. 23, 2021

(65) Prior Publication Data
US 2021/0265918 A1 Aug. 26, 2021

(30) Foreign Application Priority Data

Feb. 24, 2020 (EP) .................................... 20159089

(51) Int. Cl.
*H02M 7/00* (2006.01)
*H05K 7/20* (2006.01)
*B60L 50/50* (2019.01)

(52) U.S. Cl.
CPC .......... *H02M 7/003* (2013.01); *B60L 50/50* (2019.02); *H05K 7/2089* (2013.01); *H05K 7/20845* (2013.01); *B60L 2210/10* (2013.01)

(58) Field of Classification Search
None
See application file for complete search history.

(56) References Cited

U.S. PATENT DOCUMENTS

| 8,169,780 | B2* | 5/2012 | Yoshino | H05K 7/20927 |
| | | | | 361/689 |
| 9,793,711 | B2* | 10/2017 | Augesky | H02M 3/1584 |
| 9,887,627 | B2* | 2/2018 | Erickson, Jr | H02J 3/381 |
| 10,193,442 | B2* | 1/2019 | Parto | H02M 3/156 |
| 10,625,618 | B2* | 4/2020 | Forssell | B60L 50/16 |

(Continued)

FOREIGN PATENT DOCUMENTS

| DE | 197 35 531 A1 | 2/1999 |
| DE | 20 2013 1 03 910 U1 | 12/2014 |

OTHER PUBLICATIONS

Extended European Search Report for European Application No. 20159089.0 dated Apr. 15, 2020, 9 pages.

*Primary Examiner* — Robert J Hoffberg
(74) *Attorney, Agent, or Firm* — Amin, Turocy & Watson, LLP

(57) ABSTRACT

A mounting base can comprise: a group of mounting areas, each mounting area of the group of mounting areas comprising: a respective mechanical connector member of a group of respective mechanical connector members for attaching to a complementary mechanical connector member on each direct-current to direct-current (DC/DC) converter unit of the group of DC/DC converter units, and a respective electrical connector of a group of respective electrical connectors for attaching to a complementary electrical connector on each DC/DC converter unit of the group of DC/DC converter units, a group of electrical conductors attached to the group of respective electrical connectors in each mounting area, and attached to a main connector on the mounting base for connecting to a high-voltage (HV) connector of a main HV supply, and a cooling channel extending in heat conducting contact with the group of mounting areas.

19 Claims, 4 Drawing Sheets

(56) References Cited

U.S. PATENT DOCUMENTS

| | | | |
|---|---|---|---|
| 10,978,948 B2* | 4/2021 | Du | H02M 7/487 |
| 2010/0321889 A1 | 12/2010 | Yoshino et al. | |
| 2018/0262018 A1* | 9/2018 | Satoh | H02J 7/022 |

* cited by examiner

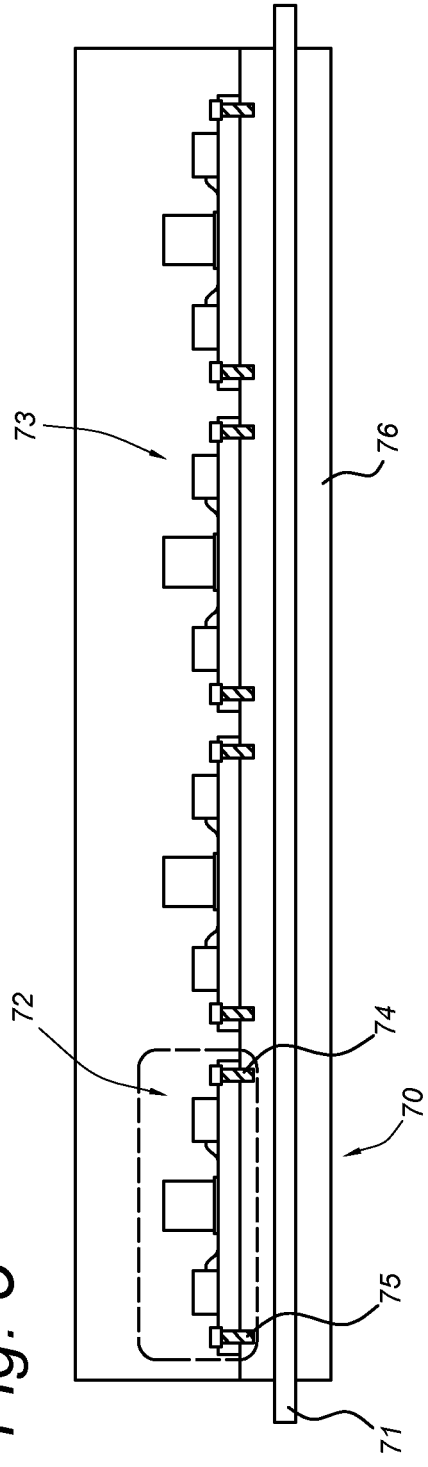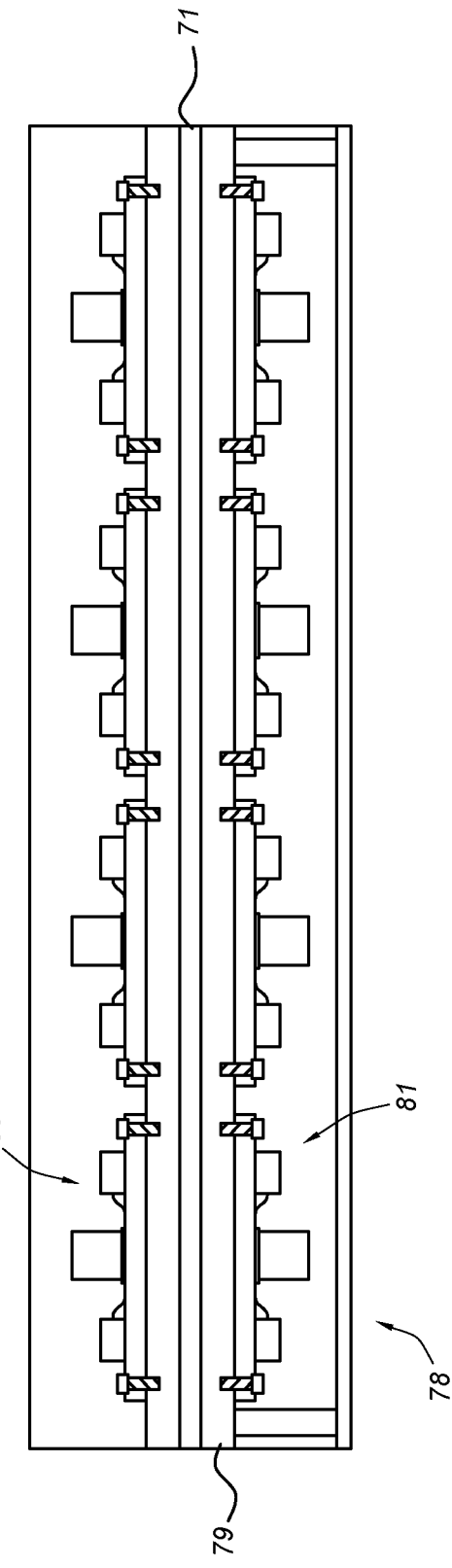

MODULAR POWER SUPPLY

CROSS-REFERENCE TO RELATED APPLICATIONS

The present Patent Application claims priority to EP patent application 20159089.0 filed Feb. 24, 2020, the entire contents of which is incorporated herein by reference.

FIELD OF THE INVENTION

The invention relates to a mounting base for attaching to direct-current to direct-current (DC/DC) converter units, such as used in electric vehicles.

The invention also relates to an assembly of a mounting base and DC/DC converter units and to an electric vehicle comprising such an assembly.

BACKGROUND ART

Electric vehicles have a fixed size high-voltage (HV) battery/fuel cell or supercapacitor, that is connected via a DC/DC converter to a direct-current (DC)-link that connects to a DC/AC converter that in turn drives the electric motor. The DC-link may also charge a low-voltage (LV) battery that powers secondary devices. These secondary devices such as lights, fans or dashboard are powered by (lead/acid) batteries of various sizes.

The varying power needs of different vehicles is handled by having a DC/DC converter of fixed size and to use varying sizes of energy storage for the secondary devices. The solution that is realized with lead-acid batteries results in increased weight, assigning of space and issues in relation to environmental sustainability.

This lay-out has the disadvantage that the known secondary power systems are heavy, require a lot of space and raises issues in view of sustainability.

There is a need for a flexible design that allows easy adaptation of the electric components to the vehicle lay-out with minimum impact on the mechanical and thermal design.

SUMMARY

According to the invention, a mounting base is provided for attaching three or more DC/DC converter units, the mounting base comprising:
- three or more mounting area's each with a mechanical connector member for attaching to a complementary mechanical connector member on the units, and an electrical connector for attaching to a complementary electrical connector on the units,
- an electrical conductor attached to the electrical connectors in each mounting area, and attached to a main connector on the mounting base, for connecting to a HV connector of a main HV supply,
- a cooling channel extending in heat conducting contact along the mounting areas,
- for at least two mounting areas a switching member on the mounting base for connecting with a first terminal to an output of the converter unit and having a second terminal for connecting to a secondary electric unit.

The mounting base according to the invention provides a modular DC/DC converter configuration and can be mechanically and electrically connected to a varying number of DC/DC converter units, that may be manufactured with a standardized mechanical and electrical connectors. The mounting base is of standardised dimensions and lay-out and can be fitted with the number and with the type of converter units, depending on the configuration of secondary devices that need to be powered by the HV power source that is utilized in a specific type of electric vehicle.

The DC/DC converters may have different output voltages to support multiple voltage levels of the secondary devices.

The mounting base can be populated with different numbers of DC/DC converters to support different power requirements in a cost-effective manner.

Groups of DC/DC converters may be clustered to enable redundancy of secondary devices for loads that are safety critical. The invention provides increased safety as failure of one DC/DC converter only reduces the total power output by 1/n when n DC/DC converters are connected to the base.

The HV power source of the vehicle is connected to the main connector on the mounting base for powering each of the LV converter units. These LV converter units, which may have different output voltages, are placed in heat-exchanging contact with the cooling channel in the mounting base.

Each DC/DC converter unit on the mounting base is with its output connected to the first terminal of a switch that with its second terminal is arranged for attaching to a secondary electrical unit. The switches effect the distribution of power to the secondary devices, and may have a fuse functionality. Each modular DC/DC converter can independently contribute to the power output of the assembly of mounting base and converter units. By operation of the switches, the secondary electrical units can be selectively powered by the DC/DC converter units.

The standardized mounting base according to the invention forms an electrical, thermal and mechanical interface that is easily scalable for varying the output power by variation of the number of converter units. By use of the mounting base, the 12-volt (V) board net, fuses and distribution boxes can be omitted.

In an embodiment of the mounting base according to the invention, a mounting area is provided with mechanical and electrical connectors for connecting to a logic unit on the base. The logic unit may comprise algorithms for functional control of the DC/DC converter units, operating the switches. The logic unit also diagnoses functionality of the DC/DC converter units, switch and fuse functionality and communicates with the vehicle control system. The logic unit may contain software functionality with high safety integrity.

In a further embodiment, a switching member is adapted for connecting the output of a first converter unit to a second converter unit, to provide a predetermined redundant output voltage at the output of the combined converter units.

In this way a redundant voltage output can be obtained using a number of converter units in parallel.

In one embodiment, the cooling device comprises a central cooling channel with on an upper and on a lower side thereof a support member that is in heat conducting contact with the cooling channel, each support member comprising at least two mounting areas for carrying converter units. This results in a compact construction that occupies a relatively small surface area.

In another embodiment, two or more parallel rows of at least two mounting areas are placed on the same side of the mounting base. This results in a construction of reduced height dimensions.

BRIEF DESCRIPTION OF DRAWINGS

Some embodiments of a mounting base for attaching to DC/DC converter units for use in electric vehicles, will by way of non-limiting example be described in detail with reference to the accompanying drawings. In the drawings:

FIG. 5 shows a cross-sectional side view of a mounting base with a central cooling channel, FIG. 6 shows a cross-sectional side view of a mounting base with a central cooling channel and converter units on an upper and on a lower side.

DESCRIPTION OF EMBODIMENTS

Figure 1:
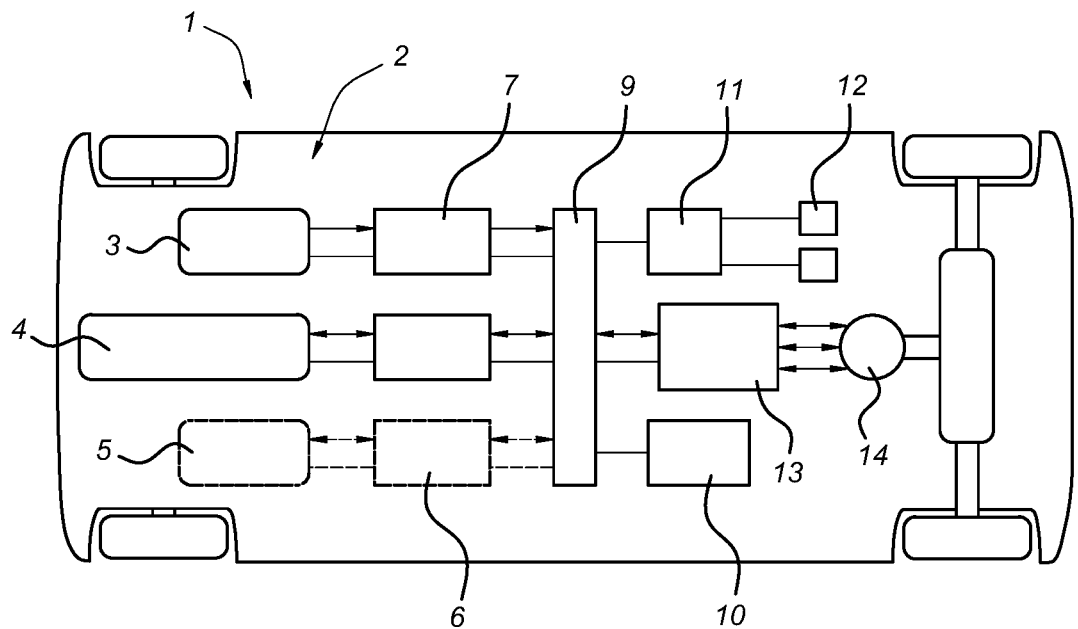
FIG. 1 shows a schematic view of a known electric vehicle.

FIG. 1 shows a known electric vehicle 1 with a high voltage power unit 2 that can comprise one or more fuel cells 3, super capacitors 4 and/or a battery 5. The battery 5 may be a Lithium-ion battery having multiple cells and a power of for instance 100 kilowatt-hour (kWh). The high voltage output of the power unit 2, which may for instance be 400 V, is converted to a low voltage such as 24 V or 48 V, by a DC/DC converter 6, 7. The low voltage is distributed via a DC-link 9 to an inverter 13, which produces an AC voltage driving an electric motor 14. The DC-link 9 also powers secondary devices 10 and 12.

The devices 12, such as lighting, climate control or window wipers, are powered by a LV lead/acid battery 11 that is charged by the DC-link output. For each type of secondary devices 12 that operate at different voltage levels, a separate battery 11 is required.

Figure 2:
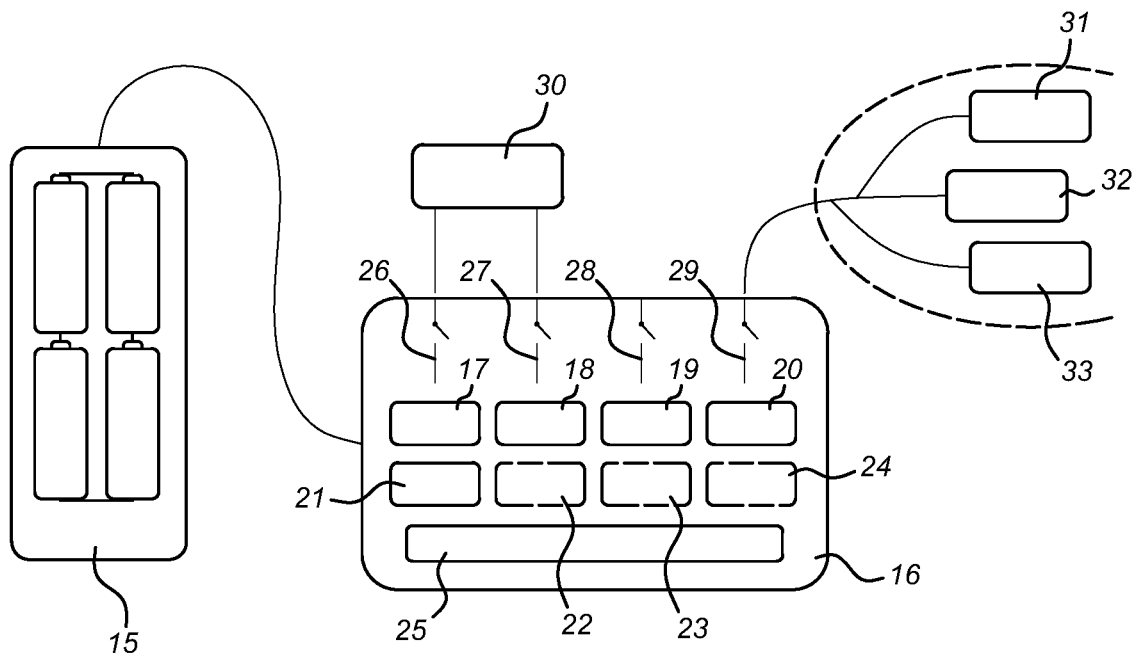
FIG. 2 shows a schematic view of an assembly of a mounting base and a number of DC/DC converter units according to the invention.

FIG. 2 schematically shows an assembly according to the invention of a HV battery 15 and a mounting base 16 comprising a number of DC/DC converters 17-20 having as an example, a 48 V output voltage, a DC/DC converter 21 with an output voltage that differs from the voltage of converters 17-20, a logic unit 22, 23 for Highly Autonomous Driving (HAD) control, a software Configuration Management module 24, or a Logic Unit 25. A number of solid-state switches 26-29 selectively connect the outputs of the DC/DC converters 17-20 to secondary devices such as an Electric Power Assisted Steering (EPAS) unit 30 or an Electric Control Unit (ECU) 31, 32 or 33.

The modular DC/DC assembly is built from a number of isolated DC/DC blocks 17-21. Each DC/DC block contributes independently to the total output power from the modular DC/DC assembly. The DC/DC blocks can have different output voltages to create a DC/DC that supports multiple voltage levels on the secondary side.

The mounting base 16 can be populated with different numbers of DC/DC blocks to support different needs of power output in a cost-effective way. The independent DC/DC blocks can be clustered to enable redundancy on the secondary side for safety critical loads. In case of n DC/DC converters, by a failure in one DC/DC block the total output power is only decreased with 1/n. In case for instance, one of the DC blocks 17, 18 is defective, the switches 26, 27 can disconnect the malfunctioning DC block from the EPAS and connect the DC blocks that function properly.

The DC/DC converter units 17-21 all have a defined electrical, mechanical and thermal interface to be able to populate the mounting base 16 with blocks that are manufactured by a variety of suppliers.

Figure 3:
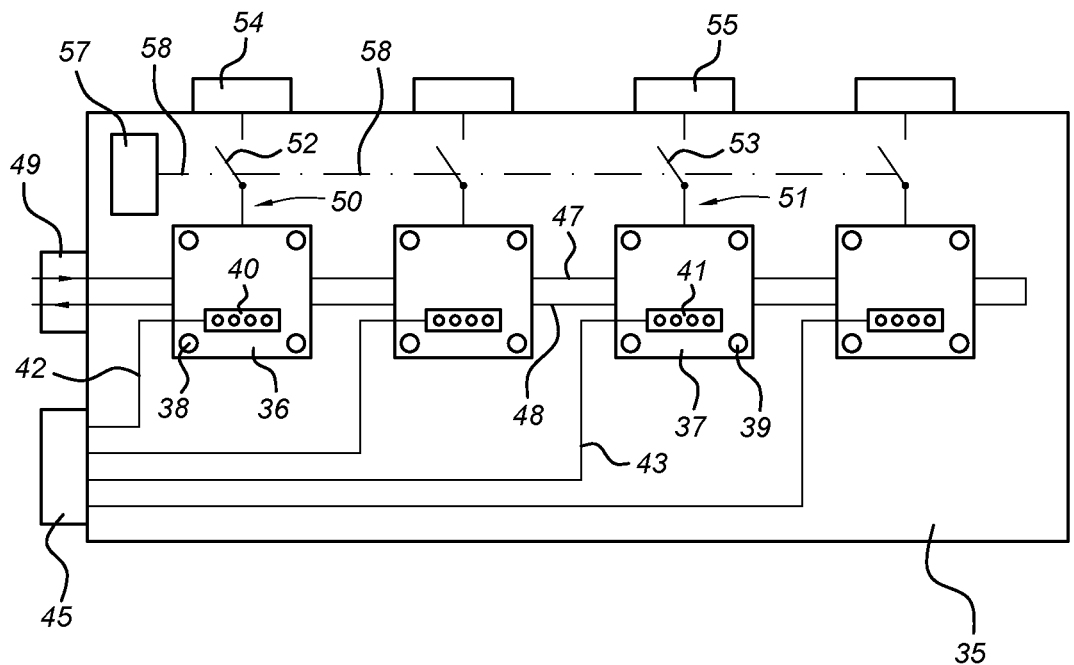
FIG. 3 shows an embodiment of a mounting base according to the invention.

FIG. 3 shows an embodiment of a mounting base 35 with mounting areas 36, 37 of standardized dimensions, having mechanical connectors 38, 39 and electrical connectors 40, 41. The mechanical connectors 38, 39 can comprise threaded bores, pins, bolts, holes and the like, for connecting with complementary mechanical connectors on the DC/DC blocks. The electrical connectors 40, 41 are connected to conductors 42, 43 on the base 35 that are connected to a main connector 45. The main connector 45 can be connected to the HV battery 15 on the vehicle.

In the body of the mounting base 35, a cooling channel 47, 48 extends in heat conducting contact with the mounting areas 36, 37 such that coolant can be circulated along the DC/DC blocks via inlet and outlet port 49.

The output of each DC/DC block on the mounting areas 36, 37 is connected to a first terminal 52, 53 of a solid state switch 50, 51, that can with a second terminal 54, 55 be connected to a secondary electric device. The switches can be controlled by an electronic control unit 57 via a control line 58.

Figure 4:
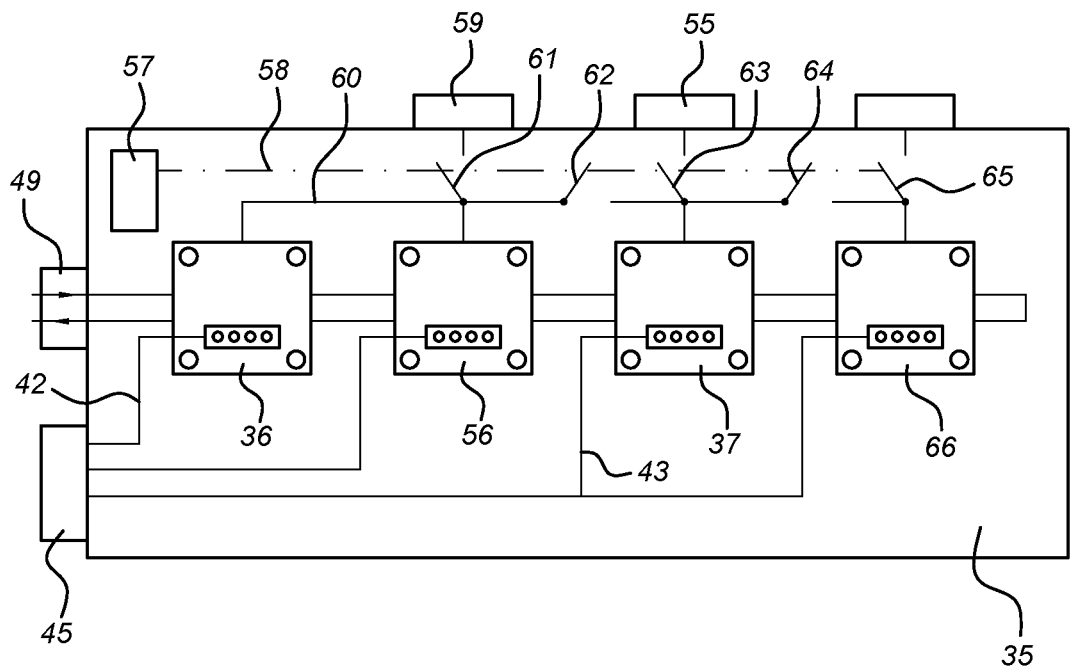
FIG. 4 shows another embodiment of a mounting base according to the invention.

FIG. 4 shows an embodiment in which the output 60 of the DC/DC block in mounting area 36 is combined with the output of the block in mounting area 56. Via the switch 61, the combined outputs can be connected to a terminal 59. Via switches 62, 64, the outputs of the DC blocks in mounting areas 37, 66 can be further interconnected.

FIG. 5 shows a cross-sectional side view of a mounting base 70 having a metal body 76 with an internal cooling channel 71. The DC/DC blocks 72, 73 are releasably fixed on top of the body 76 via mechanical connectors 74, 75.

FIG. 6 shows a cross-sectional side view of a mounting base 78 with a metal body 79 having a central cooling channel 71 and on a top side 80 and a bottom side 81 a number of DC blocks.

Figure 7:
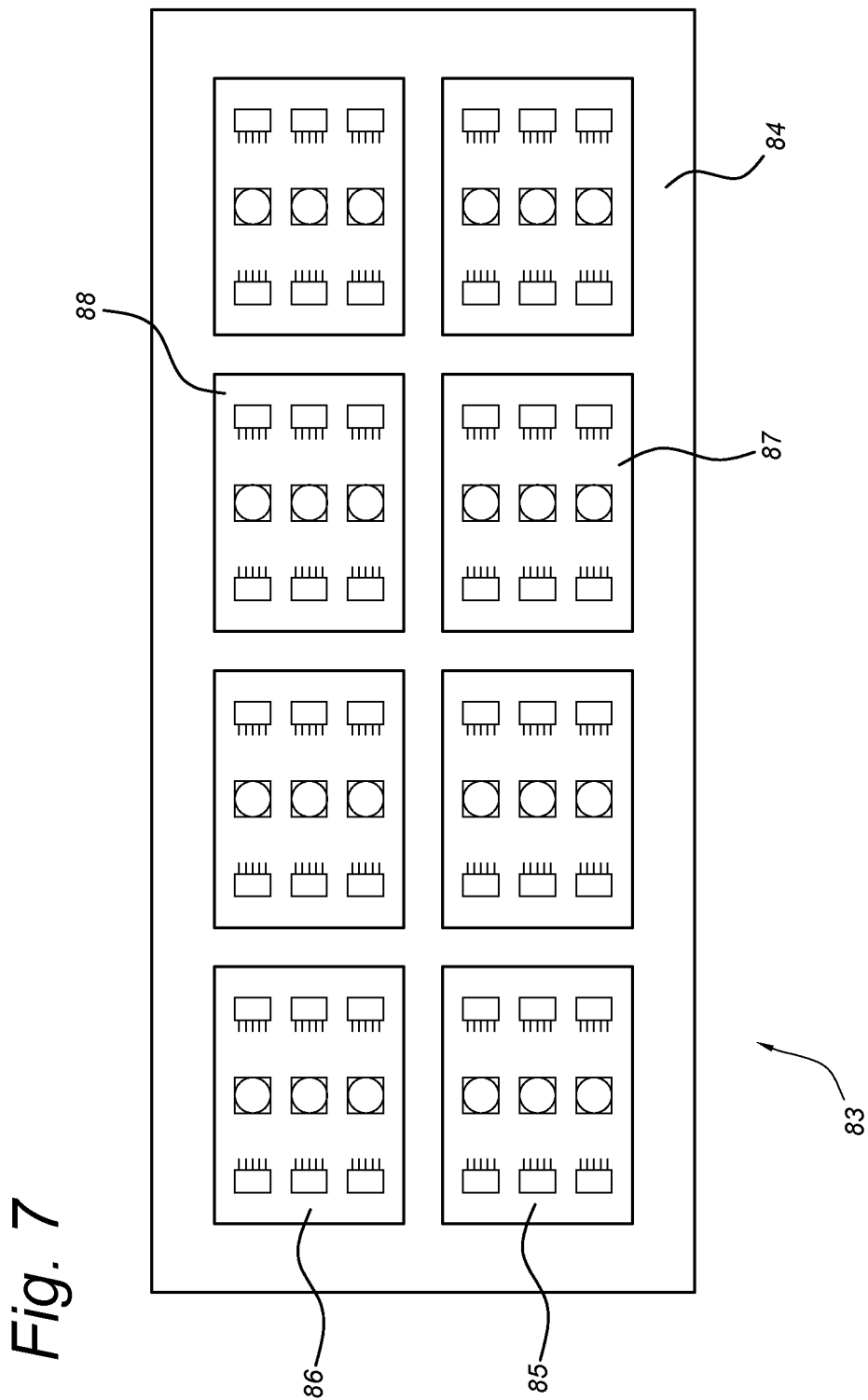
FIG. 7 shows a top plan view of a mounting base with two parallel rows of converter units.

FIG. 7 shows a plan view of a mounting base 83 with a metal body 84 comprising two parallel rows 85, 86 each comprising four DC blocks 87, 88.

What is claimed is:

1. A mounting base for attaching a group of direct-current to direct-current (DC/DC) converter units, the mounting base comprising:
   a group of mounting areas, each of the mounting areas comprising:
      a respective one of a group of mechanical connector members for attaching to a complementary mechanical connector member on a respective one of the DC/DC converter units, and
      a respective one of a group of electrical connectors for attaching to a complementary electrical connector on the respective one of the DC/DC converter units;
   a group of electrical conductors attached to each of the electrical connectors, and attached to a main connector on the mounting base, the main connector configured for connecting to a high-voltage (HV) connector of a main HV source;
   a cooling channel extending in heat conducting contact with the mounting areas; and
   a switching member placed on the mounting base outside of at least two of the mounting areas, the switching member having:
      a first terminal connected to an output of at least two of the DC/DC converter units, the at least two of the group of DC/DC converter units placed on the at least two of the mounting areas, and a second terminal for connecting to a secondary electric unit, the secondary electric unit situated a distance from the mounting base.

2. The mounting base according to claim 1, wherein the switching member is configured to connect the output of a first one of the DC/DC converter units to the output of a second one of the DC/DC converter units.

3. The mounting base of claim 1, wherein the DC/DC converter units comprises at least three DC/DC converter units.

4. The mounting base of claim 1, wherein the mounting areas comprises at least three mounting areas.

5. The mounting base according to claim 1, further comprising a logic mounting area of the mounting areas, the logic mounting area comprising the mechanical connectors and the electrical connectors for connecting to a logic unit placed on the mounting base in the logic mounting area.

6. The mounting base according to claim 1, wherein the cooling channel comprises a central cooling channel, a support member that is in heat conducting contact with the central cooling channel on each of an upper and on a lower side of the central cooling channel, each support member comprising at least two mounting areas of the mounting areas, each of the at least two of the mounting areas for carrying the respective one of the DC/DC converter units.

7. The mounting base according to claim 6, wherein the at least two of the mounting areas of each support member comprise two or more parallel rows, each of the two or more parallel rows having the at least two of the mounting areas.

8. The mounting base according to claim 1, wherein at least two of the DC/DC converter units have different output voltages from each other.

9. The mounting base according to claim 1, wherein at least two DC/DC of the DC/DC converter units are arranged with respective outputs in parallel.

10. An assembly, comprising:
a group of mounting areas, each of the mounting areas comprising:
a respective one of a group of mechanical connector members for attaching to a complementary mechanical connector member on a respective one of a group of direct-current to direct-current (DC/DCl converter units, and
a respective one of a group of electrical connectors for attaching to a complementary electrical connector on the respective one of the DC/DC converter units;
a group of electrical conductors attached to each of the electrical connectors, and attached to a main connector on the assembly, the main connector configured for connecting to a high-voltage (HV) connector of a main HV source;
a cooling channel extending in heat conducting contact with the mounting areas; and
a switching member placed on the assembly outside of at least two of the mounting areas, the switching member having:
a first terminal connected to an output of at least two of the DC/DC converter units, the at least two of the DC/DC converter units placed on the at least two of the mounting areas and
a second terminal for connecting to a secondary electric unit, the secondary electric unit situated a distance from the mounting base.

11. The assembly of claim 10, wherein the at least two of the DC/DC converter units comprises three or more of the DC/DC converter units, and wherein the three or more DC/DC converter units are connected to the mounting areas.

12. The assembly according to claim 10, wherein the at least two of the DC/DC converter units have different output voltages from each other.

13. The assembly according to claim 10, wherein the output of at least two of the DC/DC converter units are arranged in parallel.

14. An electric vehicle comprising:
a group of mounting areas, each of the mounting areas comprising:
a respective one of a group of mechanical connector members for attaching to a complementary mechanical connector member on a respective one of a group of direct-current to direct-current (DC/DC) converter units, and
a respective one of a group of electrical connectors for attaching to a complementary electrical connector on the respective one of the DC/DC converter units;
a group of electrical conductors attached to each of the electrical connectors, and attached to a main connector on the assembly, the main connector configured for connecting to a high-voltage (HV) connector of a main HV source;
a cooling channel extending in heat conducting contact with the mounting areas; and
a switching member placed on the assembly outside of at least two of the mounting areas, the switching member having:
a first terminal connected to an output of at least two of the group of DC/DC converter units, the at least two of the DC/DC converter units placed on the at least two of the mounting areas, and
a second terminal for connecting to a secondary electric unit, the secondary electric unit situated a distance from the mounting base.

15. The electric vehicle of claim 14, wherein a subgroup of the DC/DC converter units are clustered for redundancy for safety-critical electrical loads.

16. The electric vehicle of claim 14, wherein a DC/DC converter unit of the DC/DC converter units comprises a step-down DC/DC converter unit.

17. The electric vehicle of claim 16, wherein the output of the step-down DC/DC converter unit comprises a is 24 volt output or 48 volt output.

18. The electric vehicle of claim 14, wherein the switching member comprises a solid-state switch.

19. The electric vehicle of claim 14, wherein the switching member is configured to connect the output of a first one of the DC/DC converter units to the output of a second one of the DC/DC converter units.

\* \* \* \* \*